(12) United States Patent
Yang et al.

(10) Patent No.: US 10,847,965 B2
(45) Date of Patent: Nov. 24, 2020

(54) CIRCUIT INTERRUPTION DEVICE WITH THERMAL PROTECTION

(71) Applicant: Eaton Intelligent Power Limited, Dublin (IE)

(72) Inventors: Lin Yang, Jiangsu (CN); Tao Xiong, Shanghai (CN); Chuanchuan Zhuang, Shanghai (CN); Xianzhen Zhang, Shanghai (CN); Fengguo Zhang, Shanghai (CN)

(73) Assignee: Eaton Intelligent Power Limited, Dublin (IE)

( * ) Notice: Subject to any disclaimer, the term of this patent is extended or adjusted under 35 U.S.C. 154(b) by 412 days.

(21) Appl. No.: 15/866,865

(22) Filed: Jan. 10, 2018

(65) Prior Publication Data

US 2019/0214809 A1   Jul. 11, 2019

(51) Int. Cl.
*H02H 5/04* (2006.01)
*H02H 3/08* (2006.01)
*G01R 31/382* (2019.01)

(52) U.S. Cl.
CPC ............ *H02H 5/041* (2013.01); *H02H 3/085* (2013.01); *H02H 5/047* (2013.01); *G01R 31/382* (2019.01)

(58) Field of Classification Search
CPC ........... H01H 2011/0068; H02H 5/041; H02H 5/042; H02H 5/048; H02H 3/08; H02H 3/085; H02H 3/10; H02H 5/04–048
See application file for complete search history.

(56) References Cited

U.S. PATENT DOCUMENTS

| | | | |
|---|---|---|---|
| 5,136,458 A | 8/1992 | Durivage, III | |
| 5,317,475 A * | 5/1994 | Siepmann | H01H 47/04 361/154 |
| 9,236,730 B2 * | 1/2016 | Chu | H02H 5/042 |
| 9,276,393 B2 | 3/2016 | Ostrovsky | |
| 2012/0275071 A1 * | 11/2012 | Gutierrez | H02H 1/0015 361/42 |
| 2015/0372478 A1 * | 12/2015 | Zhou | G01K 13/00 361/93.8 |

* cited by examiner

*Primary Examiner* — Jared Fureman
*Assistant Examiner* — Christopher J Clark
(74) *Attorney, Agent, or Firm* — Fox Rothschild LLP

(57) ABSTRACT

A thermal protection switch device may include: a power circuit that includes a phase line and a neutral line; a current sensor electrically connected to the phase line to detect the current flow in the phase line; a temperature sensor thermally coupled to the phase line to detect the temperature of the phase line; and another temperature sensor thermally coupled to the neutral line to detect the temperature of the neutral line. The device also includes a trip circuit configured to interrupt the phase line when activated and a controller configured to receive output signals from the above current and temperature sensors. The controller may activate the trip circuit to interrupt the phase line in response to determining that certain conditions have occurred.

18 Claims, 3 Drawing Sheets

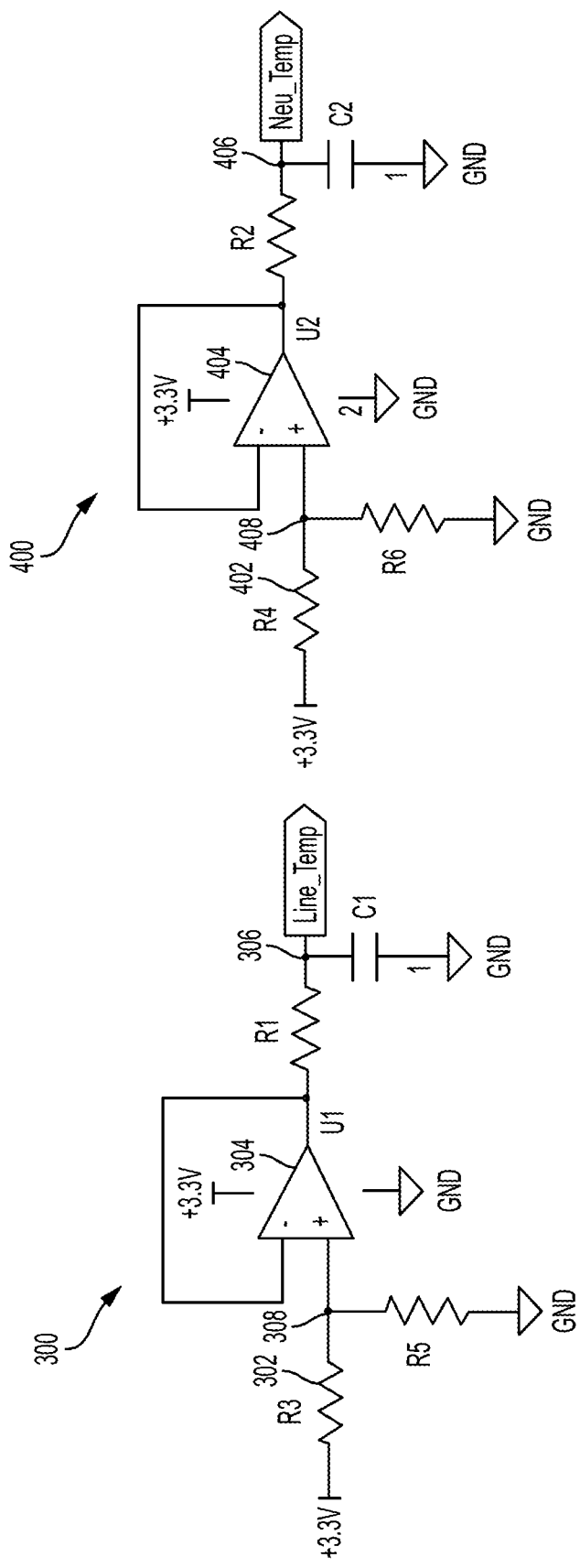

CIRCUIT INTERRUPTION DEVICE WITH THERMAL PROTECTION

BACKGROUND

This disclosure is related to a method and system for protecting a circuit switch and, in particular, to thermal protecting a circuit switch using a controller.

Circuit switches, such as circuit breakers, as well as switchgear and other electrical circuit control equipment, are designed to provide protection for power distribution systems. Circuit switches safeguard connected electrical devices and wiring against current overloads and short circuits, thereby protecting people and equipment in the field.

One problem with existing circuit switches is that sometimes the circuit switch gets too hot before the current in the load reaches a high enough threshold to trigger the switch to switch off. For example, when a receptacle of the switch does not make contact with the plug of the appliance stably, the temperature of the contact point may cause the switch to operate at a high temperature, whereby the current in the load is still normal and is therefore not high enough to trigger the switch to switch off. This will cause damage to the switch. There are other causes for a switch to operate in high abnormal temperatures, which may not be protected by conventional circuit breakers. Existing thermal switches use metal, such as copper, steel or other materials that deform (e.g., bending) in response to the temperature therein. This deformation of the metal causes a mechanical switch to switch off. However, these mechanical switches have various fragile mechanical parts inside, and they may be sensitive to ambient temperature, shocks/vibrations and other abuses.

This patent disclosure addresses some of the issues described above and/or other issues.

SUMMARY

According to various embodiments, a thermal protection switch device may include: a power circuit, a current sensor, a first temperature sensor, a trip circuit and a controller. The power circuit includes a phase line and a neutral line. The current sensor is electrically connected to the phase line to detect a current flow in the phase line and generate a first output signal based on the current flow. The first temperature sensor is thermally coupled to the phase line to detect the temperature of the phase line and generate a second output signal based on the temperature of the phase line. The trip circuit is electrically positioned to interrupt the phase line when activated. The controller is communicatively connected to the current sensor, the first temperature sensor, and the trip circuit, and is operable to receive the first output signal from the current sensor and the second output signal from the first temperature sensor. The controller may generate an output voltage to activate the trip circuit to interrupt the phase line in response to determining that any of the following conditions have occurred: the first output signal has a value that exceeds a first threshold; or the second output signal has a value that exceeds a second threshold.

The thermal protection switch device may also include a second temperature sensor thermally coupled to the neutral line to detect temperature of the neutral line and generate a third output signal based on the temperature of the neutral line. Correspondingly, the controller may additionally be communicatively connected to the second temperature sensor and operable to receive the third output signal from the second temperature sensor. The controller may also generate the output voltage to activate the trip circuit when the third output signal has a value that exceeds a third threshold.

In some scenarios, the current sensor may include a shunt that is electrically connected between the phase line and a line contact for a load. The shunt is positioned to generate a first input voltage based on the current flow through the phase line. The current sensor also may include an amplifier electrically connected to the shunt, where the amplifier may amplify the first input voltage to generate a voltage that is the first output signal. The current sensor may be configured to generate the first output signal to have a value that exceeds the first threshold, such as 3 volts, when the current flow in the phase line exceeds a current threshold, e.g. 70° C.

In some scenarios, the first temperature sensor may include an amplifier and a thermistor serially coupled between a power source and the amplifier. The thermistor may be further positioned to be electrically connected to the phase line to generate an input signal based on the temperature of the phase line. The amplifier may receive the input signal from the thermistor and generate the second output signal based on the input signal. In some scenarios, the first temperature sensor may be configured to generate the second output voltage to have a value that exceeds the second threshold when the temperature of the conductor of the phase line exceeds a temperature threshold.

In some scenarios, the second temperature sensor may include an amplifier and a thermistor that is electrically connected between a power voltage and the amplifier. The thermistor may be further positioned to be thermally coupled with the neutral line to generate an input signal based on the temperature of the neutral line. The amplifier may be configured to generate the third output voltage based on the input signal. In some scenarios, the second temperature sensor may generate the third output voltage that exceeds the third threshold when the temperature of the neutral line exceeds a temperature threshold.

In some scenarios, the trip circuit may include: a solenoid positioned to selectively open the power circuit so that no current flows to a load of the power circuit and to close the power circuit to allow current flow to the load of the power circuit; and a driving circuit electrically connected between an output of the controller and the solenoid so that the voltage at the output of the controller will trigger the solenoid to open or close the power circuit. The driving circuit may be configured to generate a current that serves as a trip signal to cause the solenoid to open the power circuit when the voltage at the output of the controller is above a voltage threshold.

In some scenarios, the controller may also include a memory device containing programming instructions that, when executed, will cause the controller to continuously monitor the first, second and third output signals, and use the first, second and third output signals to generate an output voltage for triggering the trip circuit.

According to various embodiments, a method for providing thermal protection for a power circuit may include: detecting a current flow in a phase line of the power circuit; generating a first output signal based on the current flow in the phase line; detecting a temperature in the phase line; generating a second output signal based on the temperature in the phase line; detecting a temperature in a neutral line of the power circuit; generating a third output signal based on the temperature in the neutral line; and performing certain functions by a controller. The controller may perform: receiving the first output signal, the second output signal and the third output signal; and generating an output voltage for activating a trip circuit to interrupt the phase line in response to determining that any of the following conditions have occurred. These conditions include: the first output signal has a value that exceeds a first threshold; the second output signal has a value that exceeds a second threshold; or the third output signal has a value that exceeds a third threshold.

BRIEF DESCRIPTION OF THE DRAWINGS

The following figures are shown to better understand the details of the present solution.

FIGS. 3-4 illustrate examples of first and second temperature sensors.

DETAILED DESCRIPTION

Figure 1:
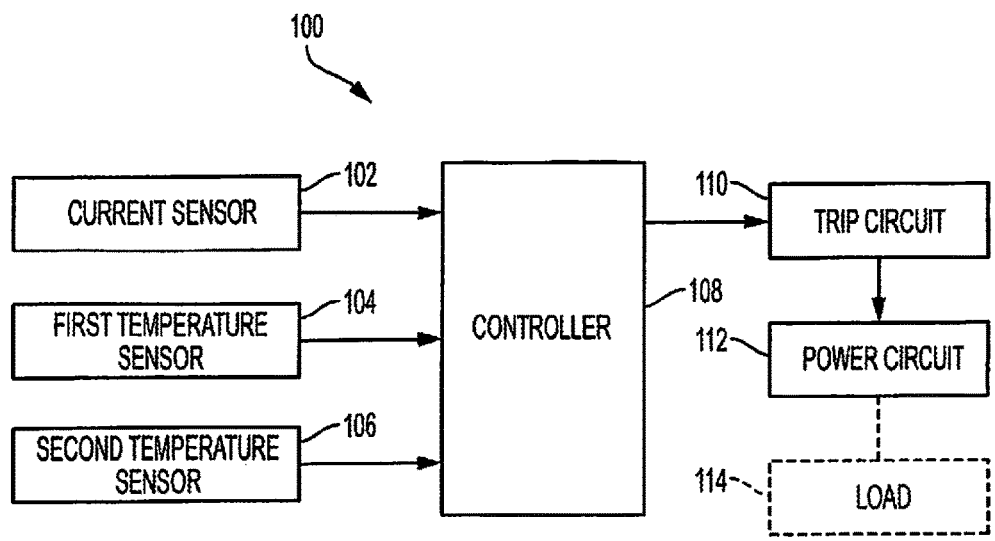
FIG. 1 illustrates an example of a thermal protection switch device.

As used in this document, the singular forms "a," "an," and "the" include plural references unless the context clearly dictates otherwise. Unless defined otherwise, all technical and scientific terms used herein have the same meanings as commonly understood by one who is of ordinary skill in the art. As used in this document, the term "comprising" means "including, but not limited to."

In this document, the terms "controller" and "controller device" refer to an electronic device or system of devices configured to command or otherwise manage the operation of one or more other devices or peripherals. A controller will typically include a processing device, and it will also include or have access to a memory device that contains programming instructions configured to cause the controller's processor to manage operation of the connected device or devices.

In this document, the terms "memory" and "memory device" each refer to a non-transitory device on which computer-readable data, programming instructions or both are stored. Except where specifically stated otherwise, the terms "memory" and "memory device" are intended to include single-device embodiments, embodiments in which multiple memory devices together or collectively store a set of data or instructions, as well as one or more individual sectors within such devices.

In this document, the term "electrically connected" as used in electrically connecting two components refers to forming a path between the two components so that electrical current may flow through. Two components that are electrically connected may be physically connected by conductors directly, or may be indirectly connected.

In this document, the term "communicatively connected" as used in communicatively connecting two components refers to transmitting data or signals from one component to another. Two components may be electrically connected to transmit data/signals in between each other. For example, one component may communicate with another component via a direct wire connection, such as a serial or USB interface. Two components also may communicate data/signals in between each other with non-contact configurations. For example, one component may communicate with another component via a wireless communication link, such as Wi-Fi, infrared (IR), Bluetooth or other near-field or short-range communication protocols, or other communication protocols.

In this document, the term "thermally coupled" as used in thermally coupling two components refers to positioning two components so that a temperature in one component may cause the characteristics of another component to change, or so that the other component can detect a temperature change in the first component. For example, "thermally coupling" may include positioning a thermistor in proximity to a conductor or in contact with the conductor so that the temperature in the conductor may cause the resistance of the thermistor to change.

In this document, the term "sensor" refers to an electronic component or a circuit that is configured to generate an output signal in response to detecting a characteristic of an electronic component or an ambient environment. For example, a current sensor may be an electronic component or a circuit that generates output signals (e.g., an output voltage) that changes the value as the current in the electronic component changes. A temperature sensor for an electronic component is an electronic component or a circuit that generates output signals that change the value as the temperature in the electronic component or in a thermally coupled component changes.

FIG. 1 illustrates an example of a thermal protection switch device 100, which includes a power circuit 112 that contains a phase line and a neutral line. The power circuit is a component or a circuit inside the switch device and connects a power line to one or more contact points for receiving a load 114. For example, the power circuit may include a circuit board electrically connected between a power line and the contact points and is operated to transfer power from the power line to the load via contact points of the power circuit, or prevent power from being transferred from the power line to the load. Operation of the power circuit 112 may be controlled by a trip circuit 110 that may interrupt the power circuit when activated. Switch device 100 also includes a controller 108 that is communicatively connected to various sensors measuring the temperature and current in the power circuit. Controller 108 receives output signals from the sensors and generates an output voltage to activate the trip circuit 110 to interrupt the power circuit based on the output signals. Various sensors are further described in detail.

In FIG. 1, the switch device 100 may include a current sensor 102 electrically connected to the phase line of the power circuit 112 to detect a current flow in the phase line and generate a first output signal based on the current flow. Alternatively, and/or additionally, switch device 100 may also include a temperature sensor 104 that is thermally coupled to the phase line to detect a temperature of the phase line and generate a second output signal based on the temperature of the phase line. Alternatively, and/or additionally, switch device 100 may include a temperature sensor 106 thermally coupled to the neutral line to detect a temperature of the neutral line and generate a third output signal based on the temperature of the neutral line.

Each of the above-described sensors 102, 104, 106 may be communicatively connected to controller 108 so that the first, second and/or third output signals can be received by controller 108. The sensors 102, 104, 106 may be configured to generate an output signal that has a value that exceeds a threshold when the condition (e.g., temperature or current) being measured exceeds a threshold. Correspondingly, controller 108, in response to receiving the output signals from the sensors 102, 104, 106, may be configured to activate trip circuit 110. For example, controller 108 may be configured to activate trip circuit 110 if one or more of the following conditions have occurred: the first output signal has a value that exceeds a first threshold; the second output signal has a value that exceeds a second threshold; or the third output signal has a value that exceeds a third threshold. These conditions are further described in detail below in context with each respective sensor.

Figure 2:
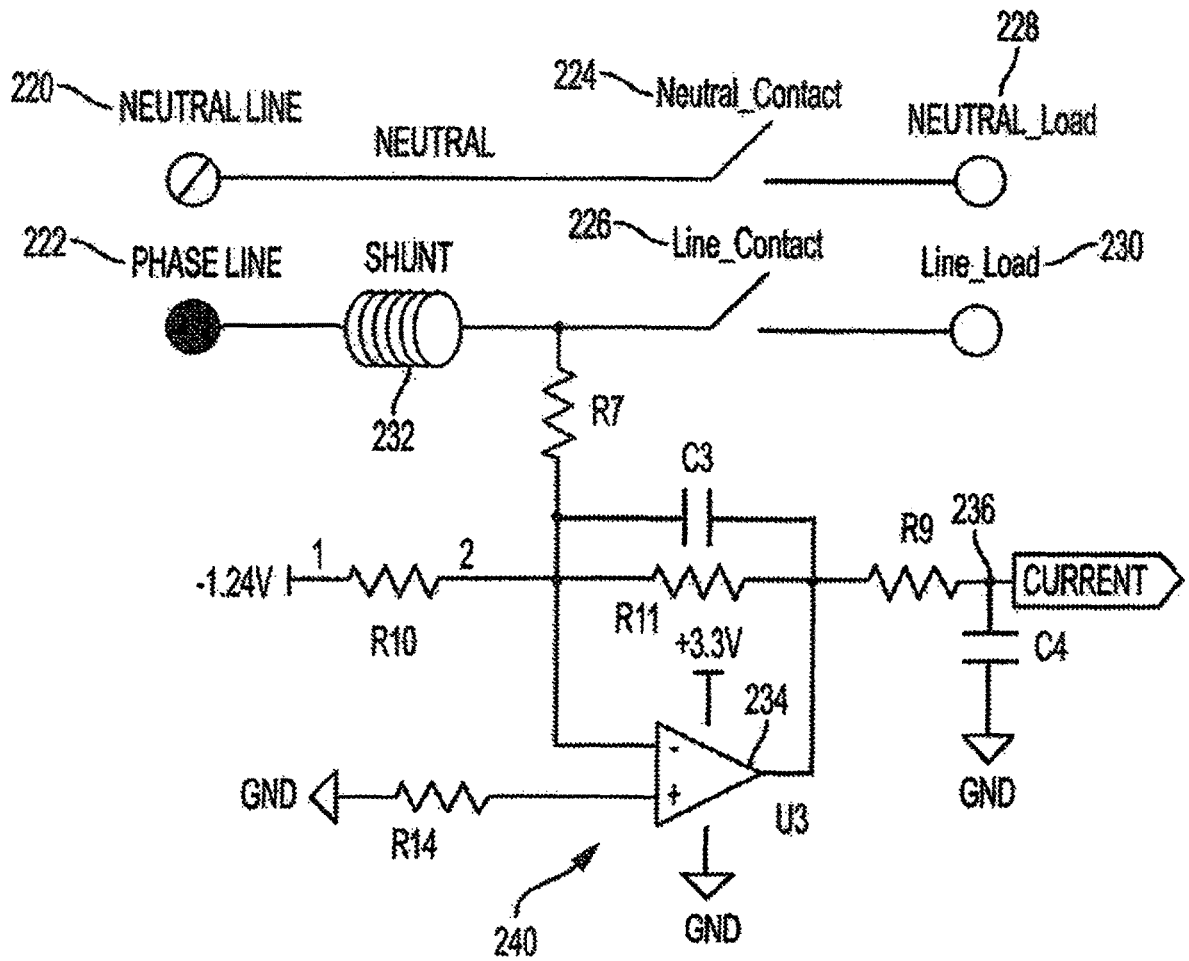
FIG. 2 illustrates an example of a current sensor.

In FIG. 2, an example of the current sensor is illustrated. In some instances, the current sensor may have a shunt 232 electrically connected to any of the lines in the power circuit. For example, shunt 232 may be electrically connected between the phase line 222 and a line contact 226 for a load, where the shunt may generate an input voltage 233 based on the current flow through the phase line. The current sensor may also have an amplifier 240 electrically connected to the shunt and configured to amplify the input voltage 233 to generate an output voltage 236. In this case, the output voltage 236 is the first output signal described above. The amplifier 240 may be an operational amplifier (op-amp) 234 having a differential input and a single output.

In some scenarios, the current sensor can be configured so that when the current in the power circuit exceeds a threshold (e.g., 10 amps or 15 amps), the sensor generates the output voltage 236 that has a value exceeding a threshold voltage (e.g., 3.0 volts (v)). When the current in the power circuit is below the threshold for the current, the sensor generates a value lower than the threshold voltage (e.g., 3.0 v). When the controller receives the first output signal from the current sensor, whether the first output signal exceeds a value of 3.0 v (or another threshold) may comprise one of the conditions that will cause the controller to output a signal that activates the trip circuit.

In FIG. 3, an example of the first temperature sensor for the phase line is illustrated. In some instances, the first temperature sensor may include a thermistor 302 that may be thermally coupled to the phase line to sense the temperature of the phase line. For example, thermistor 302 may be positioned to be in touch with a conductor of the phase line so that any temperature change in the phase line can cause the thermistor to change its resistance. A high temperature in the phase line may be caused by an overload. The high temperature may also be caused by an unstable connection between the contact point of the line and the load, or other loose connections. For example, a loose connection in the power outlet or the plug of the load may cause the temperature of the power line to be high.

The first temperature sensor for the phase line may also include an amplifier 300 electrically connected to the thermistor 302. In some scenarios, thermistor 302 may be electrically connected between a power source and amplifier 300 and generate an input signal to the amplifier. In this case, the input signal is a voltage at 308, which depends on the resistance of thermistor 302. A temperature change in the phase line may cause the resistance of the thermistor to change, which in turn changes the input signal at 308. Amplifier 300 receives the input signal from the thermistor and generates an output voltage 306 based on the input signal. In this case, the output voltage 306 is the second output signal.

In some scenarios, when the temperature in the phase line exceeds a threshold, the first temperature sensor for the phase line may be configured to generate the second output voltage to have a value that exceeds the second threshold when the temperature of the phase line exceeds a temperature threshold. For example, at room temperature (e.g., 20° C.), the temperature in the phase line is generally below 50° C. when there is a normal load. In some instances, a temperature at or above 70° C. in the phase line may be considered too high, and the first temperature sensor may be configured to generate an output voltage of 3.0 v or higher when the temperature in the phase line exceeds 70° C. Alternatively, when the temperature is in the normal range that is below 50° C., the first temperature sensor for the phase line may generate an output voltage of 2.0-2.4 v.

Like the first temperature sensor for the phase line, the second temperature sensor for the neutral line may have a similar structure and may be configured to generate the third output signal based on the temperature in the neutral line. In FIG. 4, the second temperature sensor may include a thermistor 402 that may be thermally coupled to the neutral line to sense the temperature of the neutral line. For example, thermistor 402 may be positioned to be in touch with a conductor of the neutral line so that any temperature change in the neutral line can cause the thermistor to change its resistance Similar conditions that may cause the high temperature in the phase line may also cause a high temperature in the neutral line.

The second temperature sensor for the neutral line may also include an amplifier 400 electrically connected to thermistor 402. In some scenarios, thermistor 402 may be electrically connected between a power source and amplifier 400, and generate an input signal to the amplifier. In this case, the input signal is a voltage at 408, which depends on the resistance of thermistor 402. A temperature change in the neutral line may cause the resistance of the thermistor to change, which in turn changes the input signal at 408. Amplifier 400 receives the input signal from the thermistor and generates an output voltage 406 based on the input signal. In this case, the output voltage 406 is the third output signal.

Similar to the first temperature sensor for the phase line, in some scenarios, the second temperature sensor may be configured to generate the third output signal to have a value that exceeds 3.0 v when the temperature of the neutral line exceeds a temperature threshold, such as 70° C.

Figure 5:
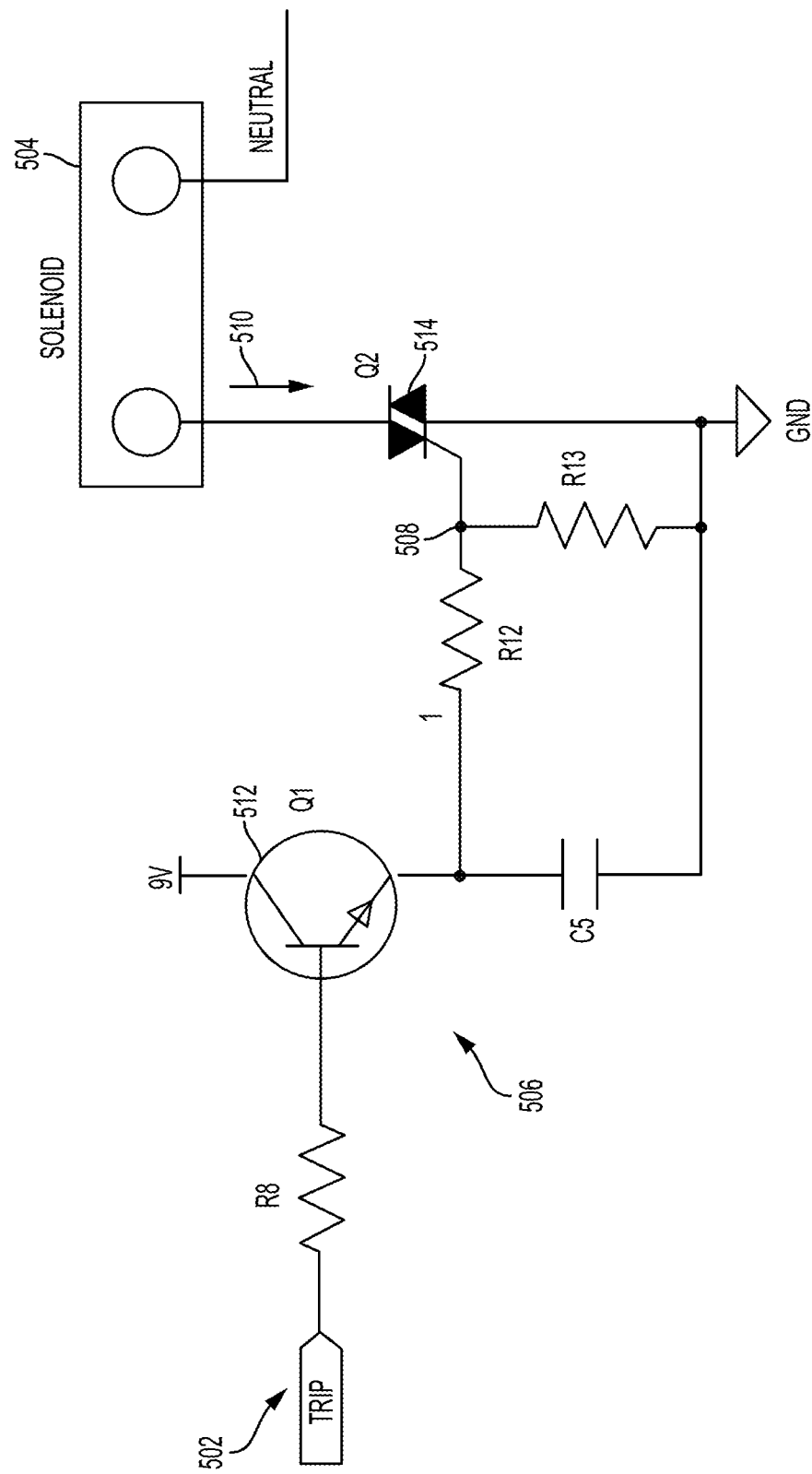
FIG. 5 illustrates an example of a trip circuit.

In FIG. 5, an example of a trip circuit is illustrated. In some scenarios, the trip circuit may include a solenoid or relay 504 positioned to selectively open the power circuit so that no current flows to a load of the power circuit and to close the power line to allow current flow to the load of the power line. The trip circuit may also include a driving circuit 506 electrically connected between the output of controller 502 and the solenoid so that a voltage at the output of controller 502 will trigger the solenoid to open or close the power circuit. For example, the driving circuit 506 may include a transistor 512 electrically connected to the output of controller 502. The output of controller 502 may be electrically connected to the gate of transistor 512, so that when one of the conditions associated with the current sensor, the first and second temperatures sensors occur, and the output of controller 502 will produce a sufficiently high voltage, e.g., 3.0 v, to cause transistor 512 to open a path between the source and drain so that current may flow.

As shown in FIG. 5, the driving circuit may further include an additional transistor 514, e.g., a TRIAC, which is triggered by the current flowing through transistor 512. When the output voltage of the controller triggers 512 to open, the current flow in 512 also may produce a voltage at 508 that causes the additional transistor 514 to open. This, in turn, will cause a current 510 to flow through the additional transistor 514. Current 510 may cause solenoid 504 to open or close. The driving circuit may be configured to generate current 510 that serves as a trip signal to cause solenoid 504 to open the power circuit when the voltage at the output of controller 502 is above a voltage threshold, such as 3.0 v.

The above illustrated embodiments use a controller to receive output signals from various sensors to monitor temperature or current of the power circuit, and generate an output signal for activating the trip circuit based on the output signals from the sensors. The controller may include a memory device that contains programming instructions that, when executed, will cause the controller to perform various thermal protection functions for the power circuit. Various methods can also be implemented in the above illustrated embodiments of the thermal protection switch circuit to detect current flow or temperatures in the power circuit, use a controller to receive the output signals that are indicative of the current flow or temperatures to generate an output signal for activating a trip circuit to interrupt the power circuit.

The above illustrated embodiments provide advantages over existing systems. For example, the thermal protection switch device uses a controller to protect a power circuit by monitoring temperature or current of the power circuit and generating an output signal for activating the trip circuit. This provides more accurate and more reliable thermal protection of the power circuit than using a mechanical device.

The features and functions described above, as well as alternatives, may be combined into many other different systems or applications as appreciated by one ordinarily skilled in the art. For example, the power circuit may additionally include ground. The thermal protection switch device may also operate to protect power in various ranges, such as 110 v, 220 v or 380 v. In some scenarios, the thermal protection switch device may use a current sensor and only one temperature sensor that is thermally coupled to either the phase or neutral line of the power circuit, instead of the first and the second temperature sensors. The controller may be operable to receive the output signals from the current sensor and that one temperature sensor to generate the output voltage to activate the trip circuit. Various alternatives, modifications, variations or improvements may be made by those skilled in the art, each of which is also intended to be encompassed by the disclosed embodiments.

The invention claimed is:

1. A thermal protection switch device comprising:
a power circuit comprising a phase line and a neutral line;
a current sensor electrically connected to the phase line to detect a current flow in the phase line and generate a first output signal based on the current flow;
a first temperature sensor thermally coupled to the phase line to detect a temperature of the phase line and generate a second output signal based on the temperature of the phase line;
a second temperature sensor thermally coupled to the neutral line to detect a temperature of the neutral line and generate a third output signal based on the temperature of the neutral line;
a trip circuit electrically positioned to interrupt the phase line when activated; and
a controller communicatively connected to the current sensor, the first and second temperature sensors, and the trip circuit, wherein the controller is configured to:
receive the first output signal from the current sensor, the second output signal from the first temperature sensor and the third output signal from the second temperature sensor, and
generate an output voltage to activate the trip circuit to interrupt the phase line in response to determining that any of the following conditions has occurred:
the first output signal has a value that exceeds a first threshold,
the second output signal has a value that exceeds a second threshold, or
the third output signal has a value that exceeds a third threshold.

2. The device of claim 1, wherein the current sensor comprises:
a shunt electrically connected in series between the phase line and a line contact for a load, wherein the shunt is configured to generate a first input voltage based on the current flow through the phase line; and
an amplifier electrically connected to the shunt and configured to amplify the first input voltage to generate a voltage that is the first output signal.

3. The device of claim 2, wherein the current sensor is configured to generate the first output signal to have a value that exceeds the first threshold when the current flow in the phase line exceeds a current threshold.

4. The device of claim 1, wherein the first temperature sensor comprises:
an amplifier; and
a thermistor electrically connected between a power source and the amplifier and is further positioned to be thermally coupled to the phase line to generate an input signal based on the temperature in the phase line;
wherein the amplifier is configured to receive the input signal from the thermistor and generate the second output signal based on the input signal.

5. The device of claim 4, wherein the first temperature sensor is configured to generate the second output signal to have a value that exceeds the second threshold when the temperature of the phase line exceeds a temperature threshold.

6. The device of claim 1, wherein the second temperature sensor comprises:
an amplifier; and
a thermistor electrically connected between a power voltage and the amplifier and is further positioned to be thermally coupled to a conductor of the neutral line to generate an input signal based on a temperature of the conductor of the neutral line;
wherein the amplifier is configured to generate the third output signal based on the input signal.

7. The device of claim 6, wherein the second temperature sensor generates the third output signal that exceeds the third threshold when the temperature of the neutral line exceeds a temperature threshold.

8. The device of claim 1, wherein the trip circuit comprises:
a solenoid positioned to selectively open the power circuit so that no current flows to a load of the power circuit and to close the power circuit to allow current flow to the load of the power circuit; and
a driving circuit electrically connected between an output of the controller and the solenoid so that a voltage at the output of the controller will trigger the solenoid to open or close the power circuit.

9. The device of claim 8, wherein the driving circuit is configured to generate a current that serves as a trip signal to cause the solenoid to open the power circuit when the voltage at the output of the controller is above a voltage threshold.

10. The device of claim 1, wherein the controller comprises a memory device containing programming instructions that, when executed, will cause the controller to:

continuously monitor the first, second and third output signals; and
use the first, second and third output signals to generate an output voltage for triggering the trip circuit.

11. A method for providing thermal protection for a power circuit comprising a phase line and a neutral line, the method comprising:
  detecting a current flow in the phase line;
  generating a first output signal based on the current flow in the phase line;
  detecting a temperature in the phase line;
  generating a second output signal based on the temperature in the phase line;
  detecting a temperature in the neutral line;
  generating a third output signal based on the temperature in the neutral line; and
  by a controller:
    receiving the first output signal, the second output signal and the third output signal, and
    generating an output voltage for activating a trip circuit to interrupt the phase line in response to determining that any of the following conditions has occurred:
      the first output signal has a value that exceeds a first threshold,
      the second output signal has a value that exceeds a second threshold, or
      the third output signal has a value that exceeds a third threshold.

12. The method of claim 11, wherein:
detecting the current flow in the phase line comprises connecting a shunt in series between the phase line and a line contact for a load; and
generating the first output signal comprises:
  generating a first input voltage based on the current flow through the phase line, and
  connecting an amplifier to the shunt to amplify the first input voltage to generate a voltage that is the first output signal.

13. The method of claim 12, wherein the first output signal has a value that exceeds the first threshold when the current flow in the phase line exceeds a current threshold.

14. The method of claim 11, wherein:
detecting the temperature in the phase line comprises:
  thermally coupling a thermistor to a conductor of the phase line, and
  electrically connecting the thermistor to a power source to generate an input signal based on the temperature in the phase line; and
generating the second output signal comprises:
  electrically connecting the thermistor between the power source and an amplifier, and
  causing the amplifier to receive the input signal from the thermistor and generate the second output signal based on the input signal.

15. The method of claim 14, wherein the second output signal has a value that exceeds the second threshold when the temperature in the phase line exceeds a temperature threshold.

16. The device of claim 14, further comprising activating the trip circuit by using the output voltage to cause a driving circuit to trigger a solenoid to open or close the power circuit.

17. The method of claim 11, wherein:
detecting the temperature in the neutral line comprises:
  thermally coupling a thermistor to a conductor of the neutral line, and
  electrically connecting the thermistor to a power source to generate an input signal based on the temperature in the neutral line; and
generating the third output signal comprises:
  electrically connecting the thermistor between the power source and an amplifier, and
  causing the amplifier to receive the input signal from the thermistor and generate the third output signal based on the input signal.

18. The method of claim 17, wherein the third output signal has a value that exceeds the third threshold when the temperature in the phase line exceeds a temperature threshold.

* * * * *

UNITED STATES PATENT AND TRADEMARK OFFICE
CERTIFICATE OF CORRECTION

| | | |
|---|---|---|
| PATENT NO. | : 10,847,965 B2 | Page 1 of 1 |
| APPLICATION NO. | : 15/866865 | |
| DATED | : November 24, 2020 | |
| INVENTOR(S) | : Lin Yang et al. | |

It is certified that error appears in the above-identified patent and that said Letters Patent is hereby corrected as shown below:

In the Claims

In Claim 16, at Column 10, in Line 18, replace, "device" with "method".

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*